(12) United States Patent
Ishizuya

(10) Patent No.: US 8,963,133 B2
(45) Date of Patent: Feb. 24, 2015

(54) ORGANIC ELECTROLUMINESCENT ELEMENT

(75) Inventor: Koji Ishizuya, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 288 days.

(21) Appl. No.: 13/590,802

(22) Filed: Aug. 21, 2012

(65) Prior Publication Data

US 2013/0069046 A1     Mar. 21, 2013

(30) Foreign Application Priority Data

Sep. 16, 2011   (JP) .................... 2011-203058

(51) Int. Cl.
*H01L 35/24* (2006.01)
*H01L 51/52* (2006.01)

(52) U.S. Cl.
CPC ................... *H01L 51/5271* (2013.01)
USPC .................... 257/40; 257/E51.001

(58) Field of Classification Search
USPC ............................ 257/40, E51.001
See application file for complete search history.

(56) References Cited

U.S. PATENT DOCUMENTS

| | | | |
|---|---|---|---|
| 7,040,796 B2 | 5/2006 | Sugiura et al. | |
| 7,053,420 B2 | 5/2006 | Tadatomo et al. | |
| 7,812,361 B2 | 10/2010 | Xu et al. | |
| 8,013,514 B2 | 9/2011 | Park et al. | |
| 2004/0022515 A1 | 2/2004 | Sugiura et al. | |
| 2004/0113166 A1 | 6/2004 | Tadatomo et al. | |
| 2005/0007793 A1 | 1/2005 | Yoshida et al. | |
| 2006/0278888 A1 | 12/2006 | Kim et al. | |
| 2008/0277681 A1 | 11/2008 | Xu et al. | |
| 2009/0291237 A1 | 11/2009 | Park et al. | |
| 2009/0295284 A1 | 12/2009 | Park et al. | |

FOREIGN PATENT DOCUMENTS

| | | |
|---|---|---|
| CN | 1498427 A | 5/2004 |
| CN | 1622727 A | 6/2005 |
| CN | 1905219 A | 1/2007 |
| CN | 101304058 A | 11/2008 |
| JP | 2004-55202 A | 2/2004 |
| JP | 2005-55481 A | 3/2005 |

OTHER PUBLICATIONS

U.S. Appl. No. 13/603,929, filed Sep. 5, 2012.

(Continued)

*Primary Examiner* — Anthony Ho
(74) *Attorney, Agent, or Firm* — Fitzpatrick, Cella, Harper & Scinto

(57) ABSTRACT

Provided is an organic electroluminescent element that achieves increased emission intensity in the front direction of the organic electroluminescent element without reducing the size of the light-emitting region thereof. The organic electroluminescent element includes: a reflective electrode; an organic electroluminescent layer including a light-emitting layer; a transparent electrode; and a light extraction structure between the reflective electrode and the organic electroluminescent layer, the structure being of a protruding shape having inclined portions whose widths gradually narrow from the reflective electrode toward a light extraction side, in which: the light extraction structure is provided on the reflective electrode to surround a light-emitting region; in a cross section taken along a plane perpendicular to the reflective electrode where an angle of an inclination angle formed between the reflective electrode and each of the inclined portions is largest, the angle of the inclination angle is 23° or more to 33° or less.

5 Claims, 5 Drawing Sheets

(56) References Cited

OTHER PUBLICATIONS

U.S. Appl. No. 13/625,225, filed Sep. 24, 2012.
U.S. Appl. No. 13/600,379, filed Aug. 31, 2012.
Akiyoshi Mikami et al., Late-News Paper: High Efficiency 200-lm/W Green Light Emitting Organic Devices Prepared on High-Index of Refraction Substrate, SID 09 Digest, 60.4L, pp. 907-910 (2009).
Chinese office action issued in corresponding application No. 201210335011.6, dated Dec. 3, 2014—10 pages with English translation.

ORGANIC ELECTROLUMINESCENT ELEMENT

BACKGROUND OF THE INVENTION

1. Field of the Invention

The present invention relates to an organic electroluminescent (EL) element, and more specifically, to an organic EL element that has a structure for extracting guided wave light in a front direction.

2. Description of the Related Art

In order to reduce the power consumption of an organic EL element, it is necessary to increase the emission intensity of the organic EL element. A known method increases the emission intensity of an organic EL element by extracting guided wave light trapped in the organic EL element, due to total internal reflection, among light emitted from a light-emitting layer of the organic EL element.

FIG. 7 is a schematic cross-sectional view of an organic EL element 101 of the related art. Entrapment of guided wave light due to total internal reflection is described by referring to FIG. 7. Typically, a substrate 102 is made of glass (having a refractive index of about 1.5), a transparent electrode 106 is made of indium tin oxide (ITO), indium zinc oxide (IZO (trademark)), or the like (having a refractive index of about 1.9 to 2.1), and a light-emitting layer 105 inside an organic EL layer is made of $Alq_3$ or the like (having a refractive index of about 1.7 to 1.9). These materials are stacked substantially in parallel. When light passes from a medium having a high refractive index to a medium having a low refractive index, total internal reflection occurs, according to Snell's law, at an incident angle of equal to or higher than the critical angle. In the organic EL element 101, roughly two total internal reflections occur.

A first total internal reflection occurs at the interface between the transparent electrode 106 and the substrate 102, because the substrate 102 has a lower refractive index than the light-emitting layer 105. Because the totally internally reflected light is transformed into guided wave light 111 while being repeatedly reflected by the interface between the substrate 102 and the transparent electrode 106 and the interface between the reflective electrode 103 and the organic EL layer 104, the light is trapped in the organic EL element 101. Since this guided wave light 111 is not extracted to an outer area 110 (air) of the organic EL element 101, it decreases the emission intensity of the organic EL element 101. Thus, in order to increase the emission intensity, a medium having a lower refractive index than the light-emitting layer 105 should not be provided between the light-emitting layer 105 and the outer area 110.

A second total internal reflection occurs at the interface between the substrate 102 and the outer area 110, because the outer area 110 (air) has a lower refractive index than the light-emitting layer 105. Because the totally internally reflected light is transformed into guided wave light 111' while being repeatedly reflected by the interface between the substrate 102 and the outer area 110 and the interface between the reflective electrode 103 and the organic EL layer 104, the light is trapped in the organic EL element 101. In order for the light emitted from the organic EL element 101 to be viewed by human eyes, the light needs to be extracted to the outer area 110. Therefore, substitution by a material having a high refractive index, as in the case of the first total internal reflection, cannot be used. Thus, in order to increase the emission intensity, it is necessary to prevent the interface between the organic EL element 101 and the outer area 110 from satisfying the total-internal-reflection condition by changing the angle of the interface between the organic EL element 101 and the outer area 110 or by causing the light to be scattered at the interface.

Akiyoshi Mikami SID '09 DIGEST P. 907 60.4 L proposes a configuration for reducing the two total internal reflections described above, in which the substrate is made of a material having a higher refractive index (2.0) than the light-emitting layer so that there is no material having a lower refractive index than the light-emitting layer between the light-emitting layer and the outer area of the organic EL element, and in which spherical lenses are formed on the substrate, at the interface with respect to the outer area. According to the report, this configuration improves the efficiency of extracting light to the outside.

Japanese Patent Application Laid-Open No. 2005-055481 proposes a configuration for reducing the above-mentioned second total internal reflection, in which square-pyramid-shaped light extraction structures, which are three-dimensional bodies having inclined portions, are provided on the organic EL element, at the interface with respect to the outer area. The light extraction structures having the inclined portions provided on a light extraction side of the organic EL element in this manner change the angle of the interface between the organic EL element and the outer area with respect to the guided wave light. Japanese Patent Application Laid-Open No. 2005-055481 improves the efficiency of extracting light to the outside by setting the angle of the inclined portions such that total internal reflection is less likely to occur.

SUMMARY OF THE INVENTION

With the configuration proposed in Akiyoshi Mikami SID '09 DIGEST P. 907 60.4 L, in which a plurality of lenses having a high refractive index are provided for a surface light source, i.e., an organic EL element, the efficiency of extracting light to the outside and the emission intensity on the high-angle side are likely to improve, whereas the emission intensity in the front direction, which is particularly important, is less likely to improve. This is because the provision of a plurality of lenses for a surface light source, such as an organic EL element, which emits light in all directions without any directivity, cannot adopt an optical design for focusing light in an intended direction.

On the other hand, in a configuration in which the size of the light-emitting region of an organic EL element is sufficiently reduced relative to the lenses so that the organic EL element serves as a point light source, the emission intensity in the front direction can be increased by adopting an optimum lens design for the point light source. However, as the size of the light-emitting region becomes smaller, the density of current required by the organic EL element to emit light becomes larger, and the degradation rate of the emission intensity of the organic EL element increases.

In addition, the inventors of the present invention have found that when a light extraction structure having an inclined portion is disposed between a reflective electrode and an organic EL layer, such an effect that a large quantity of guided wave light is extracted in the front direction is obtained without setting the angle of the inclined portion of the light extraction structure to the angle based on the description of Japanese Patent Application Laid-Open No. 2005-055481.

The present invention provides an organic EL element that achieves increased emission intensity in the front direction without reducing the size of the light-emitting region thereof, by providing a structure for extracting a large quantity of guided wave light in the front direction between a reflective electrode and an organic EL layer.

To solve the problems, according to the present invention, there is provided an organic EL element, including: a reflective electrode; an organic electroluminescent layer including a light-emitting layer; a transparent electrode; and a light extraction structure between the reflective electrode and the organic electroluminescent layer, the structure being of a protruding shape having inclined portions whose widths gradually narrow from the reflective electrode toward a light extraction side, in which: the light extraction structure is provided on the reflective electrode so as to surround a light-emitting region; in a cross section taken along a plane perpendicular to the reflective electrode where an angle of an inclination angle formed between the reflective electrode and each of the inclined portions is largest, the angle of the inclination angle is 23° or more to 33° or less, and a position having a largest thickness of the light extraction structure is positioned on the reflective electrode; and an inclined portion closer to the light-emitting region with respect to the position having the largest thickness of the light extraction structure and an inclined portion farther from the light-emitting region with respect to the position having the largest thickness of the light extraction structure are disposed on the reflective electrode.

The present invention enables a large quantity of guided wave light to be extracted in the front direction, regardless of the size of the light-emitting region of the organic EL element. Accordingly, the emission intensity in the front direction of the organic EL element can be increased.

Further features of the present invention will become apparent from the following description of exemplary embodiments with reference to the attached drawings.

DESCRIPTION OF THE EMBODIMENTS

Hereinafter, preferred embodiments of an organic EL element of the present invention are described with reference to the drawings. Note that parts not shown or described in this specification use a technique known in the art or a publicly known technique. The present invention is not limited to the embodiments described below.

Figure 1A:
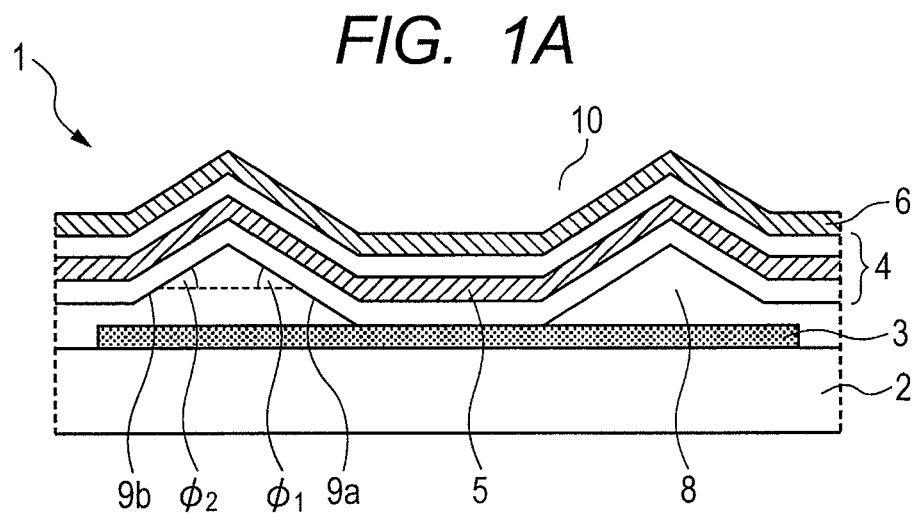
FIG. 1A is a schematic cross-sectional view of an organic EL element of the present invention and FIG. 1B is a schematic plan view of the organic EL element.
Figure 1B:
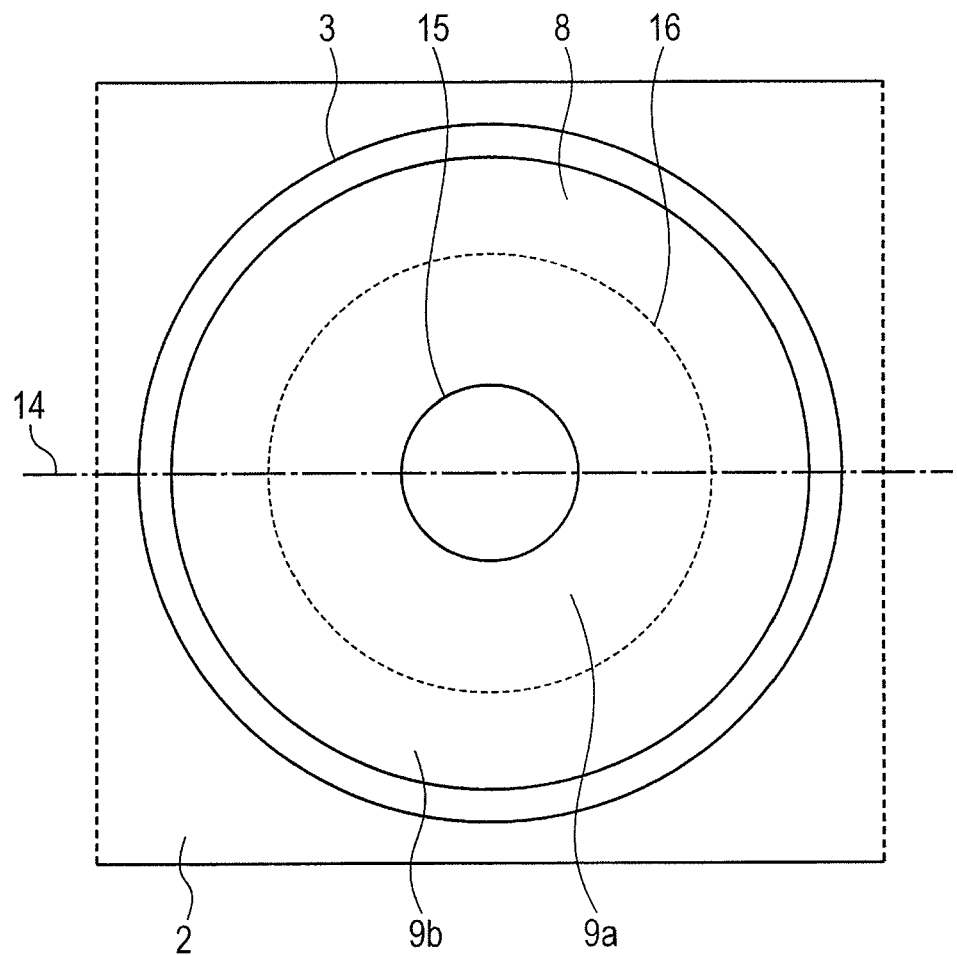

FIGS. 1A and 1B are each a schematic view illustrating an example of an organic EL element of the present invention. FIG. 1B is a schematic plan view when the organic EL element is viewed from a front direction (an organic EL layer 4 and a transparent electrode 6 are not shown), and FIG. 1A is a schematic cross-sectional view when the organic EL element is cut along a plane including a line segment 14 of FIG. 1B. An organic EL element 1 is provided with a reflective electrode 3, the organic EL layer 4 including a light-emitting layer 5, and the transparent electrode 6 in the stated order from the side of a substrate 2, and is provided with a light extraction structure 8 between the reflective electrode 3 and the organic EL layer 4.

The substrate 2 is made of glass, plastic, silicon, or the like. The substrate 2 may be provided with a switching device (not shown), such as a thin film transistor (TFT).

The reflective electrode 3 that reflects light emitted from the organic EL element 1 toward the light extraction side is provided on the substrate 2. The reflective electrode 3 is desirably made of a metal having a high reflectivity or an alloy thereof; Al, Ag, Pt, Au, Cu, Pd, Ni, etc., are particularly suitable. The reflective electrode 3 may be a layered body in which an oxide transparent conducting material having a high work function, such as ITO or IZO (trademark), is stacked on top of the metal or the alloy thereof.

The light extraction structure 8 is formed on the reflective electrode 3. The light extraction structure 8 is of a protruding shape having inclined portions 9 whose widths gradually narrow from the reflective electrode 3 toward a light extraction side (the side of an outer area 10) (FIG. 1A), and is provided on the reflective electrode so as to surround a light-emitting region (FIG. 1B). The light extraction structure 8 is formed of an insulating material, and the inside of the region surrounded with the light extraction structure 8 serves as a light-emitting region 15. As described above, the light extraction structure 8 has a function of specifying the light-emitting region. The light extraction structure 8 has the two inclined portions 9, and an inclined portion 9a is provided on an inner peripheral side and an inclined portion 9b is provided on an outer peripheral side. The inclined portion 9a and the inclined portion 9b are in contact with each other at a ridge 16. In addition, in a cross section taken along a plane perpendicular to the reflective electrode 3 where the angle of an inclination angle formed between the reflective electrode 3 and each inclined portion is largest, an inclination angle $\phi_1$ formed between an extension of the inclined portion 9a and the reflective electrode 3, and an inclination angle $\phi_2$ formed between an extension of the inclined portion 9b and the reflective electrode 3 are each set to fall within the range of 23° or more to 33° or less. Although an increasing effect on a front emission intensity is obtained as long as each inclination angle falls within the range, the inclination angle is particularly preferably 25° or more to 30° or less. Further, the angles of the inclination angles of two inclined planes, i.e., the inclination angle $\phi_1$ and the inclination angle $\phi_2$ are preferably the same angle. In FIG. 1B, the light extraction structure 8 is formed so that the inner periphery of the light extraction structure 8 may be of a circular shape, and as a result, the light-emitting region 15 is specified as being of a circular shape. However, the shape of the inner periphery of the light extraction structure 8 is not particularly limited, and an arbitrary shape such as an elliptical shape or a quadrangular shape is permitted.

In addition, when the light extraction structure is cut along a plane perpendicular to the reflective electrode 3, a position having the largest thickness thereof is positioned on the reflective electrode 3. Further, when cut along a plane perpendicular to the reflective electrode, the light extraction structure 8 desirably has, on the reflective electrode 3, an inclined portion closer to the light-emitting region with respect to the position having the largest thickness of the light extraction structure 8, and an inclined portion farther from the light-emitting region with respect to the position having the largest thickness of the light extraction structure 8. In other words, both the inclined portion 9a provided on the inner peripheral side and the inclined portion 9b provided on the outer peripheral side are formed on the one reflective electrode 3.

As described above, the light extraction structure 8 needs to be an insulating material. In addition, the light extraction structure 8 is preferably formed of a material that absorbs a small quantity of light and has a high transmittance. In view of those conditions, an inorganic nitride such as silicon nitride (SiN) or titanium oxide (TiN), an inorganic oxide such as silicon oxide ($SiO_2$), titanium oxide ($TiO_2$), zinc oxide (ZnO), aluminum oxide ($Al_2O_3$), or zirconium oxide (ZrO), or an organic material such as an acrylic resin or a polyimide resin is particularly suitable. In addition, the light extraction structure 8 may be a material obtained by mixing multiple of those materials, or may be a layered body of multiple of the materials. Although the refractive index of the light extraction structure 8 is not particularly specified, the refractive index is preferably on a par with that of the light-emitting layer 5.

The organic EL layer 4 including at least the light-emitting layer 5 is formed on the reflective electrode 3 and along the protruding shape formed by the light extraction structure 8, and part of the surface of the organic EL layer 4 is also of a protruding shape having an inclined portion. The organic EL layer 4 may include, for example, a hole injection layer, a hole transport layer, an electron blocking layer, a hole blocking layer, an electron transport layer, or an electron injection layer in addition to the light-emitting layer 5. A known organic EL material can be used in each layer.

The transparent electrode 6 having a refractive index equal to or higher than the refractive index of the light-emitting layer 5 is formed on the organic EL layer 4 along the protruding shape of the organic EL layer 4, and part of the surface of the transparent electrode 6 is also of a protruding shape having an inclined portion. The transparent electrode 6 is preferably formed of a material that absorbs a small quantity of light and has a high transmittance, and a transparent conducting material such as ITO or IZO (trademark) is particularly suitable.

The outer side of the transparent electrode 6, that is, the outer area 10 of the organic EL element 1, is desirably formed of a material having a lower refractive index than the light-emitting layer 5; gas such as air or nitrogen, an organic material such as an acrylic resin or a polyimide resin, or an inorganic oxide such as $SiO_2$ is particularly suitable.

Figure 2A:
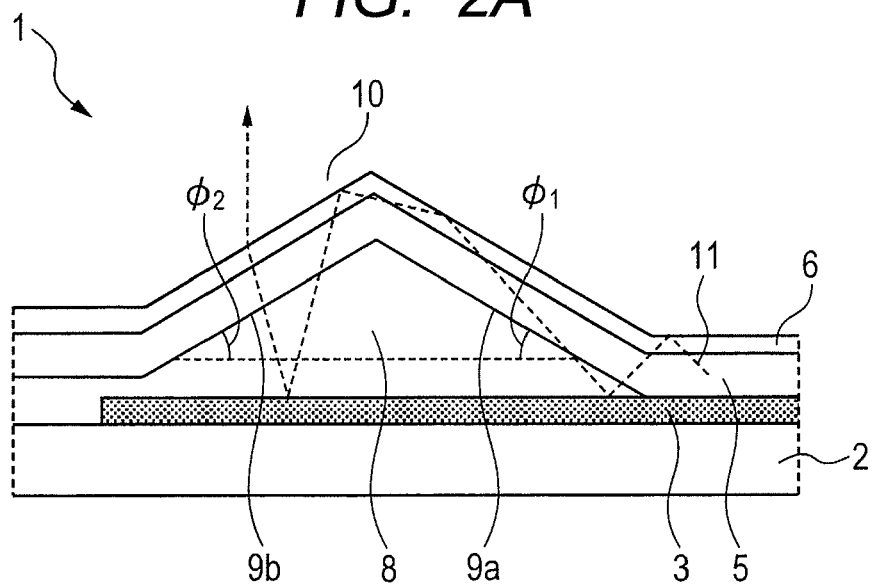
FIGS. 2A and 2B are each an explanatory diagram illustrating a mechanism for increasing an emission intensity in the front direction of the organic EL element.
Figure 2B:
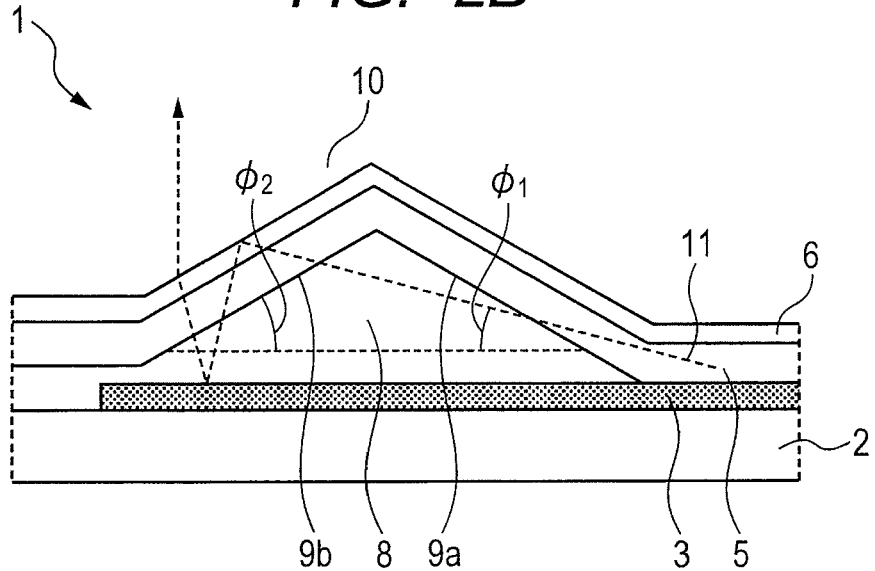

Next, referring to FIGS. 2A and 2B, two mechanisms for increasing the emission intensity in the front direction of the organic EL element of the present invention are described. These mechanisms are characterized in that guided wave light 11 in the organic EL element 1, after being totally internally reflected by the interface between the transparent electrode 6 formed along the protruding shape of the light extraction structure 8 and the outer area 10, is reflected by the reflective electrode 3 and extracted in the front direction. The "front direction" herein means the direction perpendicular to the reflective electrode 3 and oriented from the reflective electrode 3 toward the light extraction side.

FIG. 2A illustrates a "three reflection mode," which is a first front-emission-intensity (emission intensity in the front direction) increasing mechanism of the organic EL element of the present invention. In the "three reflection mode," the guided wave light 11 in the organic EL element 1 is reflected twice by the interface between the transparent electrode 6 on the light extraction structure 8 and the outer area 10 and is then reflected by the reflective electrode 3, thereby being extracted in the front direction of the organic EL element 1. FIG. 2A is a cross-sectional view taken along a surface perpendicular to the reflective electrode 3, where the inclination angle $\phi_1$ formed between the reflective electrode 3 and the inclined portion 9a of the light extraction structure 8 and the inclination angle $\phi_2$ formed between the reflective electrode 3 and the inclined portion 9b are the largest. Illustration of the organic EL layer is omitted in FIG. 2A.

As illustrated in FIG. 2A, among the light emitted from the light-emitting layer 5, the guided wave light 11 that satisfies the total-internal-reflection condition at the interface of the outer area 10 is guided in the organic EL element 1, while being repeatedly reflected by the reflective electrode 3 and the interface between the transparent electrode 6 and the outer area 10.

The guided wave light 11 that has reached the light extraction structure 8 is totally internally reflected at the interface between the transparent electrode 6 on the inclined portion 9a and the outer area 10, and then the guided wave light 11 advances toward the interface between the transparent electrode 6 on the inclined portion 9b and the outer area 10. Next, the guided wave light 11 is totally internally reflected at the interface between the transparent electrode 6 on the inclined portion 9b and the outer area 10, and then the guided wave light 11 advances toward the reflective electrode 3. Then, the guided wave light 11 is reflected at the reflective electrode 3. After that, the light is caused to exit in the front direction without being totally internally reflected at the interface between the transparent electrode 6 on the inclined portion 9b and the outer area 10, and is then extracted to the outer area 10.

As described above, in the "three reflection mode," the guided wave light 11 can be extracted in the front direction of the organic EL element 1 by providing the light extraction structure 8 having the inclined portions 9 between the reflective electrode 3 and the organic EL layer 4, and hence the emission intensity in the front direction can be increased.

FIG. 2B illustrates a "two reflection mode," which is a second front-emission-intensity (emission intensity in the front direction) increasing mechanism of the organic EL element of the present invention. In the "two reflection mode," the guided wave light 11 in the organic EL element 1 is reflected once by the interface between the transparent electrode 6 on the light extraction structure 8 and the outer area 10 and is then reflected by the reflective electrode 3, thereby being extracted in the front direction of the organic EL element 1. FIG. 2B is a cross-sectional view taken along a surface perpendicular to the reflective electrode 3, where the inclination angle $\phi_1$ formed between the reflective electrode 3 and the extension of the inclined portion 9a of the light extraction structure 8 and the inclination angle $\phi_2$ formed between the reflective electrode 3 and the extension of the inclined portion 9b are the largest. Illustration of the organic EL layer is omitted in FIG. 2B.

As illustrated in FIG. 2B, among the light emitted from the light-emitting layer 5, the guided wave light 11 that satisfies the total-internal-reflection condition at the interface of the outer area 10 is guided in the organic EL element 1, while being repeatedly reflected by the reflective electrode 3 and the interface between the transparent electrode 6 and the outer area 10.

The guided wave light 11 that has reached the light extraction structure 8 is totally internally reflected at the interface between the transparent electrode 6 on the inclined portion 9b and the outer area 10, and then the guided wave light 11 advances toward the reflective electrode 3. Next, the guided wave light 11 is reflected at the reflective electrode 3. After that, the light is caused to exit in the front direction without being totally internally reflected at the interface between the transparent electrode 6 on the inclined portion 9b and the outer area 10, and is then extracted to the outer area 10.

As described above, in the "two reflection mode," the guided wave light 11 can be extracted in the front direction of the organic EL element 1 by providing the light extraction structure 8 having the inclined portions 9 between the reflective electrode 3 and the organic EL layer 4, and hence the emission intensity in the front direction can be increased.

The organic EL element of the present invention can achieve compatibility between the two modes, i.e., the "three reflection mode" and the "two reflection mode" when the inclination angle $\phi_1$ and the inclination angle $\phi_2$ are each 23° or more to 33° or less, and hence the front emission intensity can be significantly increased.

Figure 3:
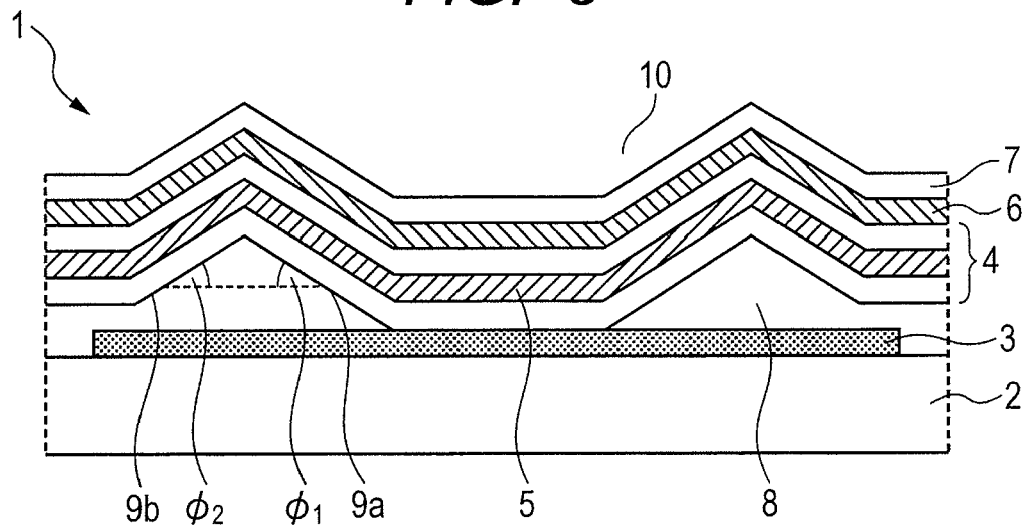
FIG. 3 is a schematic cross-sectional view of an organic EL element of Example 10.

Alternatively, as illustrated in FIG. 3, a transparent layer 7 having a refractive index equal to or higher than the refractive index of the light-emitting layer 5 may be formed between the transparent electrode 6 and the outer area 10 along the protruding shape of the transparent electrode 6. When the transparent layer 7 is provided, total internal reflection occurs at an interface between the transparent layer 7 and the outer area 10. Providing the transparent layer 7 lengthens a distance between the reflective electrode 3 and the outer area 10. Accordingly, the number of times of the reflection of the guided wave light 11 at the reflective electrode 3 upon its guidance reduces and hence light absorption at the reflective electrode 3 at the time of the guidance can be reduced. As a result, an additionally large quantity of the guided wave light can be guided to the light extraction structure 8 and hence the front emission intensity can be additionally increased. The transparent layer 7 is preferably formed of a material that absorbs a small quantity of light and has a high transmittance, and an inorganic nitride such as SiN or TiN, an inorganic oxide such as $TiO_2$, ZnO, $Al_2O_3$, ZrO, ITO, or IZO (trademark), or an organic material such as $Alq_3$ or αNPD is particularly suitable. Alternatively, the transparent layer 7 may be a layered body of materials each having a refractive index equal to or higher than the refractive index of the light-emitting layer 5.

A display can be obtained by providing the multiple organic EL elements of the present invention on a substrate, and the display can be turned into a full-color display by changing the wavelength of light to be emitted by the light-emitting layer of each organic EL element.

Hereinafter, ray tracking simulation using Monte Carlo method was performed on the organic EL element of the present invention to evaluate the emission intensity in the front direction and the efficiency of extracting light to the outside. To evaluate the emission intensity of the organic EL element, a light detector was disposed at a position 30 cm away from the organic EL element.

EXAMPLE 1

FIGS. 1A and 1B are each a schematic view of an organic EL element of this example. The description of the configuration of the organic EL element of this example is omitted because the configuration is as described above.

In this example, simulation was performed by using the following simulation model. The details of the reflective electrode 3, organic EL layer 4, light-emitting layer 5, transparent electrode 6, light extraction structure 8, and outer area 10 of this example are as follows. The simulation model of this example satisfies the necessary conditions of the present invention.

The reflective electrode 3 has a reflectivity of 95% and a diameter of 31 μmφ.

The organic EL layer 4 has a thickness of 0.2 μm, a diameter of 31 μmφ, a refractive index of 1.85, and no absorption.

The light-emitting layer 5 has a refractive index of 1.85, and no absorption. The middle portion of the organic EL layer 4 in the thickness direction was utilized as the light-emitting layer 5.

The transparent electrode 6 has a thickness of 0.1 μm, a refractive index of 2.00, and an absorption of 5%/μm.

The light extraction structure 8 has a refractive index of 1.85, an absorption of 1%/μm, an inner circumference diameter of 29 μmφ, an outer circumference diameter of 52 μmφ, an inclination angle $\phi_1$ of 30°, and an inclination angle $\phi_2$ of 30°. The center of the ridge 16 and the center of the light-emitting region 15 correspond to each other.

The outer area 10 has a refractive index of 1.0.

EXAMPLE 2

The organic EL element of this example differs from that of Example 1 in that the inclination angles $\phi_1$ and $\phi_2$ of the light extraction structure 8 are set to 23° and 23°, respectively. Other than this point, the organic EL element of this example uses the same material as that of Example 1 and has the same configuration as that of Example 1. The simulation model of this example satisfies the necessary conditions of the present invention.

EXAMPLE 3

The organic EL element of this example differs from that of Example 1 in that the inclination angles $\phi_1$ and $\phi_2$ of the light extraction structure 8 are set to 25° and 25°, respectively. Other than this point, the organic EL element of this example uses the same material as that of Example 1 and has the same configuration as that of Example 1. The simulation model of this example satisfies the necessary conditions of the present invention.

EXAMPLE 4

The organic EL element of this example differs from that of Example 1 in that the inclination angles $\phi_1$ and $\phi_2$ of the light extraction structure 8 are set to 28° and 28°, respectively. Other than this point, the organic EL element of this example uses the same material as that of Example 1 and has the same configuration as that of Example 1. The simulation model of this example satisfies the necessary conditions of the present invention.

EXAMPLE 5

The organic EL element of this example differs from that of Example 1 in that the inclination angles $\phi_1$ and $\phi_2$ of the light extraction structure 8 are set to 33° and 33°, respectively. Other than this point, the organic EL element of this example uses the same material as that of Example 1 and has the same configuration as that of Example 1. The simulation model of this example satisfies the necessary conditions of the present invention.

COMPARATIVE EXAMPLE 1

Figure 4:
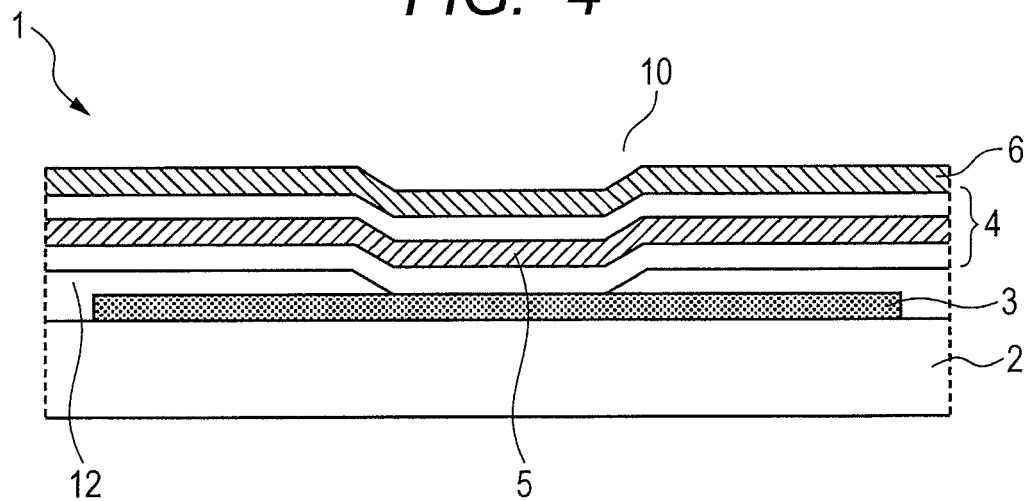
FIG. 4 is a schematic cross-sectional view of an organic EL element of Comparative Example 1.

FIG. 4 is a schematic cross-sectional view of an organic EL element of this comparative example. The organic EL element of this comparative example differs from that of Example 1 in that the light extraction structure 8 is not provided and a flat insulating layer 12 is provided instead. The diameter of the light-emitting region 15 was set to 29 μmϕ by providing the insulating layer 12. In addition, the organic EL layer 4 and the transparent electrode 6 are formed flat because the light extraction structure 8 is not provided. The simulation model of this comparative example does not satisfy the necessary conditions of the present invention.

COMPARATIVE EXAMPLE 2

The organic EL element of this example differs from that of Example 1 in that the inclination angles $\phi_1$ and $\phi_2$ of the light extraction structure 8 are set to 20° and 20°, respectively. Other than this point, the organic EL element of this example uses the same material as that of Example 1 and has the same configuration as that of Example 1. The simulation model of this comparative example does not satisfy the necessary conditions of the present invention.

COMPARATIVE EXAMPLE 3

The organic EL element of this example differs from that of Example 1 in that the inclination angles $\phi_1$ and $\phi_2$ of the light extraction structure 8 are set to 22° and 22°, respectively. Other than this point, the organic EL element of this example uses the same material as that of Example 1 and has the same configuration as that of Example 1. The simulation model of this comparative example does not satisfy the necessary conditions of the present invention.

COMPARATIVE EXAMPLE 4

The organic EL element of this example differs from that of Example 1 in that the inclination angles $\phi_1$ and $\phi_2$ of the light extraction structure 8 are set to 35° and 35°, respectively. Other than this point, the organic EL element of this example uses the same material as that of Example 1 and has the same configuration as that of Example 1. The simulation model of this comparative example does not satisfy the necessary conditions of the present invention.

COMPARATIVE EXAMPLE 5

The organic EL element of this example differs from that of Example 1 in that the inclination angles $\phi_1$ and $\phi_2$ of the light extraction structure 8 are set to 40° and 40°, respectively. Other than this point, the organic EL element of this example uses the same material as that of Example 1 and has the same configuration as that of Example 1. The simulation model of this comparative example does not satisfy the necessary conditions of the present invention.

EXAMPLE 6

The organic EL element of this example differs from that of Example 1 in that the inclination angles $\phi_1$ and $\phi_2$ of the light extraction structure 8 are set to 28° and 25°, respectively. Other than this point, the organic EL element of this example uses the same material as that of Example 1 and has the same configuration as that of Example 1. The simulation model of this example satisfies the necessary conditions of the present invention.

EXAMPLE 7

The organic EL element of this example differs from that of Example 1 in that the refractive index of the light extraction structure 8 is set to 1.50. Other than this point, the organic EL element of this example uses the same material as that of Example 1 and has the same configuration as that of Example 1. The simulation model of this example satisfies the necessary conditions of the present invention.

EXAMPLE 8

The organic EL element of this example differs from that of Example 1 in that the refractive index of the light extraction structure 8 is set to 1.75. Other than this point, the organic EL element of this example uses the same material as that of Example 1 and has the same configuration as that of Example 1. The simulation model of this example satisfies the necessary conditions of the present invention.

EXAMPLE 9

The organic EL element of this example differs from that of Example 1 in that the refractive index of the light extraction structure 8 is set to 2.00. Other than this point, the organic EL element of this example uses the same material as that of Example 1 and has the same configuration as that of Example 1. The simulation model of this example satisfies the necessary conditions of the present invention.

EXAMPLE 10

FIG. 3 is a schematic cross-sectional view of an organic EL element of this example. The organic EL element of this example differs from that of Example 1 in that the transparent layer 7 is provided between the transparent electrode 6 and the outer area 10. Other than this point, the organic EL element of this example uses the same material as that of Example 1 and has the same configuration as that of Example 1. The transparent layer 7 of this example is as described below. The simulation model of this example satisfies the necessary conditions of the present invention.

The transparent layer 7 has a refractive index of 1.85, no absorption, and a thickness of 0.8 μm.

(Simulation Results)

Table 1 shows the simulation results of Examples 1 to 10 and Comparative Examples 1 to 5, and shows the proportions of the front emission intensities to Comparative Example 1 in which the light extraction structure 8 is not provided. Hereinafter, the comparison and evaluation of the simulation results are performed with reference to Table 1.

TABLE 1

| | Refractive index of light extraction structure | Inclination angle $\phi_1$ | Inclination angle $\phi_2$ | Thickness of transparent layer | Front emission intensity (relative to Comparative Example 1) |
|---|---|---|---|---|---|
| Example 1 | 1.85 | 30° | 30° | — | 3.3 |
| Comparative Example 1 | — | — | — | — | 1 |
| Example 2 | 1.85 | 23° | 23° | — | 1.8 |
| Example 3 | 1.85 | 25° | 25° | — | 3.0 |
| Example 4 | 1.85 | 28° | 28° | — | 3.9 |
| Example 5 | 1.85 | 33° | 33° | — | 1.9 |
| Comparative Example 2 | 1.85 | 20° | 20° | — | 0.9 |
| Comparative Example 3 | 1.85 | 22° | 22° | — | 1.2 |
| Comparative Example 4 | 1.85 | 35° | 35° | — | 1.1 |

TABLE 1-continued

| | Refractive index of light extraction structure | Inclination angle $\phi_1$ | Inclination angle $\phi_2$ | Thickness of transparent layer | Front emission intensity (relative to Comparative Example 1) |
|---|---|---|---|---|---|
| Comparative Example 5 | 1.85 | 40° | 40° | — | 1.1 |
| Example 6 | 1.85 | 28° | 25° | — | 3.6 |
| Example 7 | 1.50 | 30° | 30° | — | 2.4 |
| Example 8 | 1.75 | 30° | 30° | — | 3.1 |
| Example 9 | 2.00 | 30° | 30° | — | 2.0 |
| Example 10 | 1.85 | 30° | 30° | 0.8 μm | 3.8 |

(Comparison and Evaluation of Simulation Results of Examples 1 to 5 and Comparative Examples 1 to 5)

Figure 5:
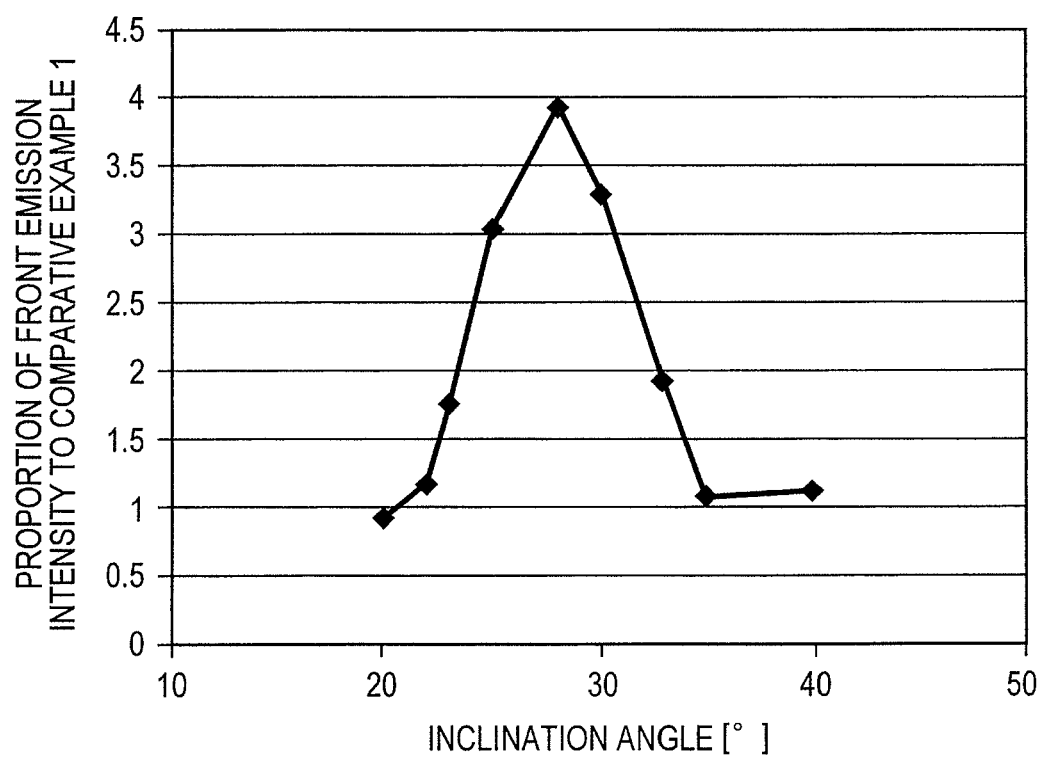
FIG. 5 is a view illustrating a relationship between the inclination angle of a light extraction structure and the proportion of a front emission intensity to Comparative Example 1.

The front emission intensity of each of Examples 1 to 5 increases as compared with that of Comparative Example 1. Here, FIG. 5 illustrates a relationship between the inclination angle $\phi_1$ or $\phi_2$ of the light extraction structure 8 and a front emission intensity proportion based on the simulation results of Examples 1 to 5 and Comparative Examples 2 to 5 of Table 1. As illustrated in FIG. 5, the front emission intensity of the organic EL element of the present invention specifically increases when the inclination angle of the light extraction structure 8 falls within the range of 23° or more to 33° or less. The graph shows that the front emission intensity is significantly increased by satisfying the necessary conditions of the present invention. In addition, the front emission intensity increases in a particularly significant fashion when the inclination angle of the light extraction structure 8 falls within the range of 25° or more to 30° or less. When the inclination angle is 28°, the front emission intensity increases to a large extent to 3.9 times that of Comparative Example 1.

(Comparison and Evaluation of Simulation Results of Example 6 and Comparative Example 1)

The front emission intensity of Example 6 increases to 3.6 times that of Comparative Example 1. Even when the angles of the inclination angles $\phi_1$ and $\phi_2$ of the light extraction structure 8 differ from each other like Example 6, the front emission intensity can be increased as long as the necessary conditions of the present invention are satisfied.

(Comparison and Evaluation of Simulation Results of Examples 1 and 7 to 9, and Comparative Example 1)

Figure 6:
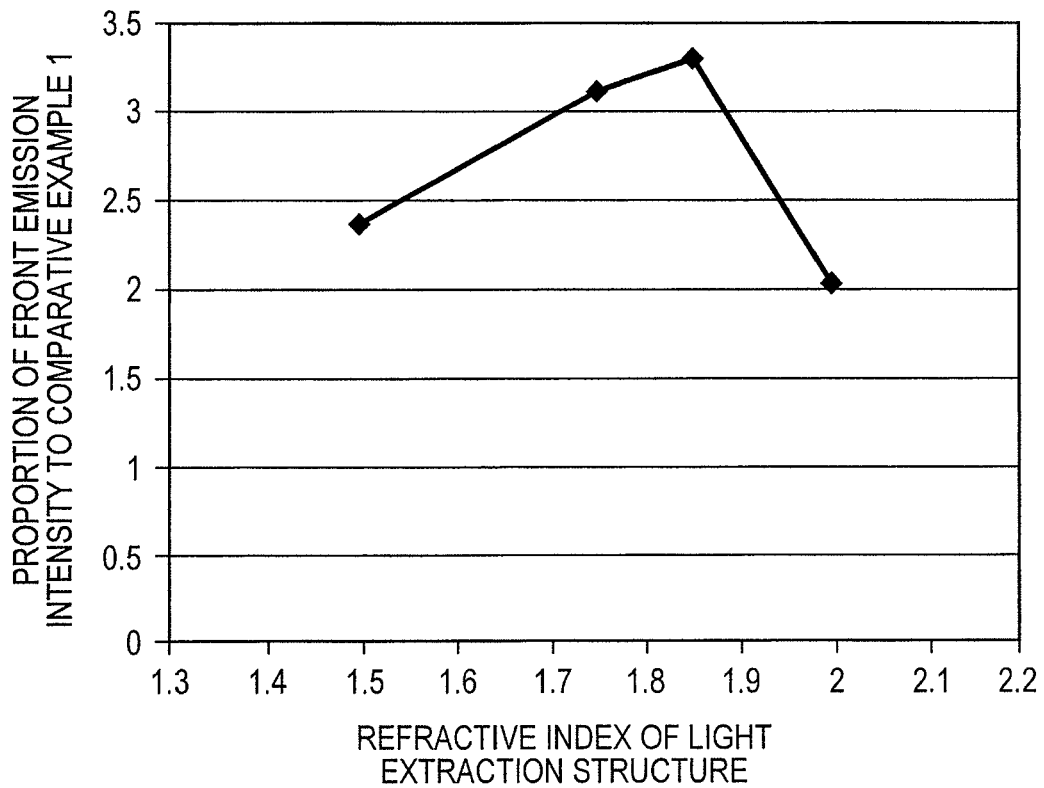
FIG. 6 is a view illustrating a relationship between the refractive index of the light extraction structure and the proportion of the front emission intensity to Comparative Example 1.
Figure 7:
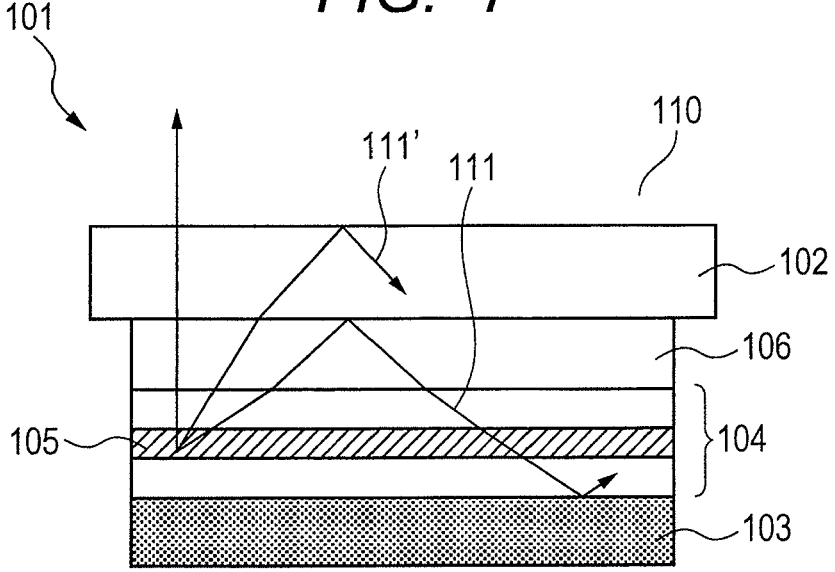
FIG. 7 is a schematic cross-sectional view of a conventional organic EL element.

The front emission intensity of each of Examples 7 to 9 increases as compared with that of Comparative Example 1, though the extent of the increase is not comparable to that of Example 1. Here, FIG. 6 illustrates a relationship between the refractive index of the light extraction structure 8 and a front emission intensity proportion based on the simulation results of Examples 1 and 7 to 9, and Comparative Example 1 of Table 1. As illustrated in FIG. 6, the front emission intensity of the organic EL element of the present invention increases irrespective of what range out of the range of 1.50 to 2.00 the refractive index of the light extraction structure 8 falls within. In addition, the front emission intensity increases in a particularly significant fashion when the refractive index of the light extraction structure 8 and the refractive index of the light-emitting layer 5 are equal.

(Comparison and Evaluation of Simulation Results of Examples 1 and 10, and Comparative Example 1)

The front emission intensity of Example 10 increases to 3.8 times that of Comparative Example 1, which means that the extent of the increase of the front emission intensity is larger than that of Example 1. This is because the light absorption of the guided wave light 11 at the reflective electrode 3 can be reduced by providing the transparent layer 7.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-203058, filed Sep. 16, 2011, which is hereby incorporated by reference herein in its entirety.

What is claimed is:

1. An organic electroluminescent element, comprising:
   a reflective electrode;
   an organic electroluminescent layer including a light-emitting layer;
   a transparent electrode; and
   a light extraction structure between the reflective electrode and the organic electroluminescent layer, the structure being of a protruding shape having inclined portions whose widths gradually narrow from the reflective electrode toward a light extraction side,
   wherein:
   the light extraction structure is provided on the reflective electrode so as to surround a light-emitting region;
   in a cross section taken along a plane perpendicular to the reflective electrode where an angle of an inclination angle formed between the reflective electrode and each of the inclined portions is largest, the angle of the inclination angle is 23° or more to 33° or less, and a position having a largest thickness of the light extraction structure is positioned on the reflective electrode; and
   an inclined portion closer to the light-emitting region with respect to the position having the largest thickness of the light extraction structure and an inclined portion farther from the light-emitting region with respect to the position having the largest thickness of the light extraction structure are disposed on the reflective electrode.

2. The organic electroluminescent element according to claim 1, wherein the inclination angles of the two inclination portions are each 23° or more to 33° or less.

3. The organic electroluminescent element according to claim 1, wherein the inclination angles of the two inclination portions are each 25° or more to 30 or less.

4. The organic electroluminescent element according to claim 1, wherein the inclination angles of the two inclination portions are equal.

5. The organic electroluminescent element according to claim 1, wherein a transparent layer having a refractive index equal to or higher than a refractive index of the light-emitting layer is provided on the light extraction side of the transparent electrode.

* * * * *